United States Patent [19]

Briska et al.

[11] 4,206,026
[45] Jun. 3, 1980

[54] PHOSPHORUS DIFFUSION PROCESS FOR SEMICONDUCTORS

[75] Inventors: Marian Briska, Boeblingen; Wolfgang W. Hoffmeister, Gaertringen; Klaus P. Thiel, Boeblingen, all of Fed. Rep. of Germany

[73] Assignee: International Business Machines Corporation, Armonk, N.Y.

[21] Appl. No.: 960,313

[22] Filed: Nov. 13, 1978

[30] Foreign Application Priority Data

Dec. 9, 1977 [DE] Fed. Rep. of Germany ....... 2754833

[51] Int. Cl.$^2$ .................... H01L 21/225; C23C 15/00
[52] U.S. Cl. ................................ 204/192 D; 148/187; 148/188; 427/85
[58] Field of Search ....................... 148/186, 187, 188; 204/192 D; 427/85

[56] References Cited

U.S. PATENT DOCUMENTS

| | | | |
|---|---|---|---|
| 2,873,221 | 2/1959 | Nijland et al. | 148/1.5 |
| 3,279,963 | 10/1966 | Castrucci et al. | 148/188 |
| 3,391,035 | 7/1968 | Mackintosh | 148/187 |
| 3,486,951 | 12/1969 | Norby | 148/188 |
| 3,725,149 | 4/1973 | Ilegems | 148/186 |
| 3,789,023 | 1/1974 | Ritchie | 252/518 |
| 3,852,086 | 12/1974 | Murata | 106/286 |

FOREIGN PATENT DOCUMENTS 1045514 10/1966 United Kingdom .
1079634 8/1967 United Kingdom .
1276203 6/1972 United Kingdom .

*Primary Examiner*—Howard S. Williams
*Assistant Examiner*—William Leader
*Attorney, Agent, or Firm*—David M. Bunnell

[57] ABSTRACT

A process for manufacturing Phosphorus-doped surface layers in semiconductor substrates. The surface of the substrate is wetted with hot phosphoric acid and then coated prior to diffusion with a layer of material which is stable at the diffusion temperature.

19 Claims, No Drawings

PHOSPHORUS DIFFUSION PROCESS FOR SEMICONDUCTORS

BACKGROUND OF THE INVENTION

The invention relates to diffusion processes for doping semiconductor substrates with phosphorus.

Together with arsenic, phosphorus is the most frequently used dopant for generating semiconductor zones of the n-type. There exist four main processes for phosphorus diffusions. The most frequently carried out is in the "open" tube, i.e., in a diffusion tube which at one end has a sufficiently large opening that a charge with semiconductor wafers can be inserted and removed again, and which at the other end is equipped with at least one gas inlet.

The phosphorus source is principally $POCl_3$ which is passed over the semiconductor wafers in a carrier of oxygen-nitrogen. If the semiconductor material is silicon, a phosphorus silicate glass is formed on the semiconductor wafers; and the phosphorus then diffuses from the glass into the semiconductor material.

Less frequently, the "open" diffusion uses phosphorus hydride as the source. This compound is highly poisonous.

It is also known to provide on the semiconductor wafers, prior to the insertion into the open tube, a phosphorus-doped oxide pyrolitically or through spin-on of a solution containing a phosphorus compound and silicic acid, said oxide then serving as phosphorus source.

Phosphorus doping may also be done by means of a capsule diffusion, using Phosphorus pentoxide as a source. Due to its highly hygroscopic effect, it is difficult to handle. The capsule diffusion is much more expensive than the "open" diffusion.

Another disadvantage of these known processes is that the entire surface of the semiconductor substrate to be doped is exposed. To obtain a selective doping it is necessary to grow thick layers, e.g. of oxide, for masking; this requires long oxidation processes. But even if these thick oxide layers are grown, there is no guarantee of complete masking because these layers may still have pores which locally may strongly reduce the oxide layer's thickness. Furthermore, in the known "open" phosphorus diffusion processes it is not easy to control the quantity of the phosphorus offered to the semiconductor wafers. Moreover, it is practically impossible with the known phosphorus diffusion processes to generate reproduceably flat, high-resistive ($R_s \geq 1200\Omega/\square$), n-doped surface layers with fixed characteristics in the semiconductor material. However, such layers are technically very interesting, and it is quite desirable to find feasible processes for their production.

Methods of making such flat, high-resistive n-doped semiconductor structures can for instance be used in the making of n-channel FET's, n-type semiconductor resistors, n-contact diffusions, flat, high-resistive, n-doped layers (n-skin), particularly for setting the necessary threshold voltage of FET's, and in the production of solar cells where it is important to dope large parts of the surface of a semiconductor substrate to form a p/n junction.

The IBM Technical Disclosure Bulletin, Vol. 18, No. 1, June 1975, page 155, teaches a process where a deposition is obtained by dipping semiconductor material into an arsenic dopant. The deposition takes place electrochemically, which is possible with arsenic owing to its metallic properties, but not with phosphorus. This process is not suitable for the reproduceable production of highly resistive doped layers; and it is necessary to use highly poisonous chemical substances.

In RCA Review, June 1970, page 207 ff, and in Solid State Technology, January 1972, page 34, W. Kern described the undesired effect that phosphorus originating inter alia of $PO_4^3$ ions is adsorbed at semiconductor surfaces, and that when heated to high temperatures this phosphorus diffuses into the semiconductor material, thereby causing undesired dopings. However, this effect results in depositions of only $10^{12}$ phosphorus atoms per $cm^2$. These are too low for producing technically useable, n-doped layers in p-doped semiconductor material.

Kern also points out that with decreasing pH-value of the solution containing the phosphorus ions the deposition is reduced.

SUMMARY OF THE INVENTION

The objects of our invention are to make flat, high-resistive, phosphorus-doped surface layers in semiconductor substrates within admissible tolerances, reproduceably, at low cost and of easy control in existing production facilities.

This and other objects are achieved by wetting the surface of the substrate with hot phosphoric acid and then coating the substrate prior to the diffusion with a layer of material which is stable at the diffusion temperature.

For our novel process complicated apparatus are required only for applying the covering layer and for the diffusion. Such apparatus, for example, a cathode sputtering device for applying silicon dioxide layers as the coating and diffusion furnaces, exist in every semiconductor production area. It is not necessary to alter these existing apparatus.

The deposition of phosphorus (measured in phosphorus atoms per $cm^2$) on the semiconductor material is constant in our process provided the deposition takes longer than 12 seconds, and the temperature remains within a very broad range. The thickness of the covering layer is not critical above a minimum value, which is in the order of 500 Å when silicon dioxide applied by cathode sputtering is used. Thus, our novel process merely requires strict control of the diffusion temperature and the diffusion time, which is no problem with modern diffusion furnaces.

Because our process permits a constant phosphorus deposition, it advantageously differs from the known "open" phosphorus diffusion processes. With our process highly advantageous surface resistances of $\geq 1000\Omega/\square$ and penetration depths (depth of the p/n junction) of $\geq 0.1$ $\mu m$ can be generated.

Such dopings can be produced with higher precision only with ion implantation. Our process, on the contrary, is much less expensive and is therefore suitable for those purposes where low manufacturing costs are more important than maximum precision.

Furthermore, ion implantation causes crystal defects which are a disturbing factor in many cases and have to be cured through annealing at high temperatures. However, this has the disadvantage that doping materials start to diffuse at these high temperatures so that it is no longer possible to obtain very flat, n-doped layers as they are required for the "n-skins".

When, as is usual in semiconductor production, semiconductor surfaces are to be selectively doped our process has the added advantage that the masking layer which partially covers the substrate to permit the selective doping of the unmasked areas of the substrate can be very thin compared to that used in the known processes; for masking is required in our process only for the deposition of phosphorus but not for the actual diffusion at high temperatures. The only requirement as to the masking layer, apart from temperature stability, is that it fully covers the semiconductor material in the masked areas during phosphorus deposition. (An exception is discussed in the specification in connection with solar cells.) With SiO$_2$ layers grown in dry oxygen this condition is satisfied at a thickness of approximately 500 Å or more. It is of no importance whether the masking layer shows any pores, provided these pores do not go from the masking layer surface to the semiconductor material. After coating and rinsing with deionized water, phosphorus is present only in those areas where the semiconductor material had been directly exposed to the phosphorus source, i.e., in our novel process, as compared to the known phosphorus diffusion processes, the deposition of the doping substance is not done over the entire surface, but selectively.

If then the entire surface of the semiconductor substrate is furthermore coated with the covering layer, the phosphorus can diffuse into the semiconductor material only in those places where it is on the semiconductor material, so that in the actual diffusion process the masking layer no longer has any function.

DESCRIPTION OF THE PREFERRED EMBODIMENTS

In the following description, the semiconductor material used consists of silicon, but our process can also be employed using other semiconductor materials.

When, as in the production of integrated circuits, a selective doping is required, the silicon substrates—generally thin wafers—are usually coated with a masking layer which does not cover those areas of the silicon surface into which the phosphorus is to be diffused. As a mask a 500 Å thick SiO$_2$ layer thermally grown in dry oxygen will suffice. Such layers do not have any pores penetrating to the silicon. If the masking layer is produced by means of other processes, for instance by means of anodic oxidation, still thinner layers can be used. This applies, for example, to the all-surface masking of the back of the silicon wafer in the production of solar cells because the p-doping through pores in the oxide layer does not have any negative effects. The thickness of the masking layer has, however, a lower limit in that the phosphoric acid also etches off SiO$_2$, with increasing speed at rising temperature (etching speed for SiO$_2$ at 200° C. ~25 Å/min, at 240° C. ~130 Å/min). The thickness of the masking layer has no upper limit. A thick oxide layer grown and left over from previous process steps can for instance be used as a masking layer. When an all-surface doping of a wafer surface is of decisive importance, as for example in solar cells, silicon wafers without a mask on the front are processed by our method.

If the silicon wafers have previously been stored for some time, prior to their being exposed to the phosphoric acid they are dipped into 10:1 H$_2$O/HF for approximately 30 seconds. This removes thin oxide layers formed under the influence of atmospheric oxygen from the silicon areas to be doped. Because, as pointed out above, the phosphoric acid etches SiO$_2$ this process step generally used in the known diffusion processes is no longer necessary, which is another advantage of our process when the silicon wafers can continuously processed without having been stored for an extended period.

The easiest way of making the phosphorus source is to start from 85 percent orthophosphoric acid which, when heated, increases in concentration and then starts to dehydrate. However, it is also possible to start from pyrophosphoric acid or metaphosphoric acid, or from a mixture of two or three of the given phosphoric acids.

The silicon wafers are dipped for between 12 and 30 seconds into the phosphorus source which has been heated to a temperature between 80 and 300° C. The effect of the phosphorus source consists in that first, as already discussed, thin oxide skins on the silicon are removed; and second, a thin layer rich in phosphorus is formed on the silicon surface. The surface quality (polishing degree) is not changed in this process. The masking layer is not covered with a phosphorus-containing layer, at any rate not with a layer which is resistant to the subsequent rinsing with deionized water. With deposition periods of $\geq 12$ seconds the maximum possible deposition with phosphorus possible at the respective deposition temperature is reached.

The given upper limit of 30 seconds is merely to indicate that a longer exposure of the silicon wafers to the phosphorus source is quite superfluous. With deposition times of less than 12 seconds, it is possible that, especially at low deposition temperatures, the maximum phosphorus deposition is not reached.

With deposition temperatures of less than 80° C. the respective deposition concentration, for reasons not precisely known, is not reached, or at any rate not with the necessary reproduceability. Possibly, at temperatures of less than 80° C. the reaction speed is too low. Above 300° C. a corrosion of the polished surface and the decomposition of the P-source has to be feared. Between 80° and 300° C. the phosphorus quantity applied on the silicon is constant; however, below 150° C. and above 230° C. the possible phosphorus quantity decreases slightly, whereas in the preferred region between 150° and 230° C. there is a maximum deposition of approximately 10$^{14}$ phosphorus atoms per cm$^2$ independently of the temperature.

After phosphorus deposition, the silicon wafers are rinsed in running, deionized water until the resistivity of the flowing-off deionized water has risen to 10 MΩ·cm.

During rinsing it is possible to carry out a predetermined reduction of the phosphorus deposition in that the silicon wafers are first dipped for a fixed period into an acidic medium, and rinsed only then with the deionized water.

After rinsing and drying, a covering layer of a material which is stable at diffusion temperature is applied on the entire surface of the silicon wafers. This layer preferably consists of silicon dioxide or silicon nitride. It is important that when the covering layer is applied, the temperature of the silicon wafers not be too high; otherwise, the phosphorus will volatilize in an uncontrolled manner. For that reason it is advisable to apply an SiO$_2$ covering layer by means of cathode sputtering. In this process it is possible to keep the temperature of the silicon wafers below 270° C. At these temperatures, the phosphorus does not volatilize significantly. The applied layer thickness should be $\geq 500$ Å. The invention does not require an upper limit of the layer thickness.

Cathode sputtering permits the reproduceable reduction of the phosphorus deposition; consequently, it allows the reproduceable influencing of the results obtained through the diffusion. This reduction of phosphorus deposition is possible, either through a controlled increase of the silicon wafer temperature to more than 270° C., or through a resputtering which is controllable through setting a specific ratio of the amplitudes of the HF-voltages applied to the cathode and anode. Such a reduction of the phosphorus deposition can be desirable if flat, highly ohmic, n-doped surface layers (n-skin with specifically high $R_s$ ($>4000\Omega/\square$) are to be made.

For making the covering layer as described above, conventional cathode sputtering devices used in semiconductor production can be used.

Now the wafers are prepared for diffusion. There is no phosphorus between the covering layer and the mask layer. Therefore, the mask layer, unlike the known phosphorus diffusion processes, is not used as a diffusion mask but has a masking function only in phosphorus deposition. It can be so thin ($\geq 500$ Å in thermally grown $SiO_2$) because, contrary to a diffusion mask, pores have no disturbing influence as long as they do not reach through the entire layer down to the silicon. In our process it is certain that a phosphorus diffusion takes place exclusively in those regions where there was bare silicon during the phosphorus deposition.

For diffusion a conventional furnace can be used that is provided with a diffusion tube which is open on one side and closed on the other, or equipped with a gas inlet, for receiving the silicon wafers to be processed. In the latter case it is advantageous to rinse the tube during diffusion with nitrogen or argon. As the phosphorus deposition, i.e., the phosphorus available for diffusion, is predetermined due to the above described manner of deposition, critical parameters of the process as disclosed by the invention for reaching predetermined diffusion data are merely diffusion temperature and diffusion time. The precise fixing of the diffusion temperature and the observing of precisely fixed diffusion times is no longer a problem with today's highly developed diffusion techniques. Unlike most of the known phosphorus diffusion processes, particularly the most frequently used diffusion with $POCl_3$ as the phosphorus source, the setting of the gas flow rates in the "open" tube is quite uncritical. Depending on the respective diffusion values, the heating takes place during diffusion between approximately 15 and approximately 120 minutes at a temperature between approximately 900° C. and approximately 1100° C.

For making n-doped, high-resistive resistors generally used in semiconductor circuits and requiring a surface resistance ($R_s$) of approximately 1 $K\Omega/\square$ and a penetration depth of 0.9 $\mu m$, diffusion took place for 50 minutes at 1100° C., with the given values being reached.

For producing particularly flat, n-doped, highly ohmic layers (n-skin), diffusion took place at a temperature of more than 1000° C. for approximately 5 minutes; and a penetration depth ($x_j$) of 0.1 $\mu m$ and an $R_s$ between 3 and 4 $k\Omega/\square$ were reached.

After the diffusion the entire covering layer applied by cathode sputtering is removed, if required. Even if the covering layer consists of $SiO_2$ this removal can be carried out in such a manner, due to the higher etching rate compared with thermally grown $SiO_2$, that existing thermally grown $SiO_2$ is not substantially affected. It is of course also possible to leave the covering layer there as a passivation layer, or to partially remove it photolithographically. Removal takes place in a conventional manner with buffered hydrofluoric acid.

To characterize the diffusions which were carried out, the surface resistance of silicon wafers whose entire surface had been phosphorus-doped was measured by means of the four-point measuring method; and the penetration depth $x_j$ by means of bevelling and staining (copper decoration). The surface concentrations ($C_o$) were determined from the obtained $R_s$ and $x_j$ values, assuming a Gaussian distribution of the doping atoms, by means of the Irvin diffusion curves. Comparisons of measurements carried out in different spots of a wafer as well as of measurements of several silicon wafers processed together or successively under the same conditions show that the diffusion values correspond satisfactorily.

In the examples below, our process is described with more detail on the basis of specific embodiments. In all these examples non-masked, p-doped silicon wafers ($3-4\cdot10^{14}$ boron atoms per $cm^3$, 11–25 $\Omega cm$) were used. The $R_s$-values given in the tables are average values of five measurements performed on one respective wafer.

EXAMPLES 1 AND 2

In these examples, the influence of the processing time of the silicon wafers in the phosphorus source and of the P-source temperature on the phosphorus depositions have been examined.

In example 1, silicon wafers were coated with phosphorus for 12 seconds each at different temperatures of the phosphorus source, then rinsed together with deionized water, coated with a covering layer, and diffused. The process conditions and the $R_s$ values are given in Table I.

Table I

| Phosphorus Deposition | | Covering Oxide | Diffusion | | |
|---|---|---|---|---|---|
| t(sec.) | T(°C.) | Thickness A | t(min.) | T(°C.) | $R_s(\Omega/\square)$ |
| 12 | 105 | 3000 | 30 | 1100 | 1500 |
| 12 | 165 | 3000 | 30 | 1100 | 1440 |
| 12 | 193 | 3000 | 30 | 1100 | 1410 |
| 12 | 220 | 3000 | 30 | 1100 | 1440 |
| 12 | 270 | 3000 | 30 | 1100 | 1530 |

The measured $R_s$-values show that for a phosphorus deposition in the given temperature range the results obtained are quite satisfactory; and, at least with temperatures of the phosphorus source between 165° and 220° C., they are very satisfactory. The rise of the $R_s$-values at the highest and the lowest temperature indicates a beginning influence of the uncontrolled mechanisms mentioned above.

In example 2, some silicon wafers were exposed in a first test for 12 seconds and some other silicon wafers were exposed in a second test for 30 seconds to the phosphorus source, and then processed as in Example 1. The process conditions and the $R_s$-values obtained thereby are given in Table II.

Table II

| Phosphorus Deposition | | Covering Oxide | Diffusion | | |
|---|---|---|---|---|---|
| t(sec.) | T(°C.) | Thickness A | t(min.) | T(°C.) | $R_s(\Omega/\square)$ |
| 12 | 220 | 3000 | 30 | 1100 | 1440 |
| 30 | 200 | 1000 | 30 | 1100 | 1410 |

Although in both tests both the deposition temperatures as well as the thicknesses of the covering oxide layers applied by cathode sputtering are different, Example 1 shows that the deposition temperatures used are in the range which supplies particularly well-corresponding results. That the thickness of the covering layer is without influence on the result when it is higher than 500 Å will be shown below. For that reason, it can be concluded from the two tests in view of the highly corresponding $R_s$-values that deposition times provided they are between 12 and 30 seconds are not critical for the diffusion result. As pointed out above, deposition times exceeding 30 seconds are not critical either.

EXAMPLES 3 AND 4

In these examples the influence of the covering layer on the diffusion result is examined.

In example 3, two silicon wafers are processed in accordance with the novel process, with the exception of the application of the covering layer which has been carried out on one wafer only. The process conditions of the $R_s$-values for one of the wafers are given in Table III.

Table III

| Phosphorus Deposition | | Covering Oxide | Diffusion | | |
|---|---|---|---|---|---|
| t(sec) | T(°C.) | Thickness A | t(min) | T(°C.) | $R_s(\Omega/\Box)$ |
| 12 | 220 | 28000 | 60 | 1100 | 915 |
| 12 | 220 | 0 | 60 | 1100 | — |

On the wafer without a covering layer no p/n-junction could be found (no reasonable $R_s$-measuring was therefore possible), i.e. the P-concentration, even directly on the Si-surface must be $<3$–$4\cdot10^{14}$ P-atoms per cm$^3$. (The boron-concentration of the Si-wafers used was at $3$–$4\cdot10^{14}$ atoms/cm$^3$). This means that obviously no phosphorus has been diffused into the semiconductor material; practically the entire phosphorus deposition, before being able to diffuse, has volatilized. The example shows that the covering layer is absolutely necessary for our novel process.

In Example 4, three silicon wafers were jointly coated with phosphorus, coated with covering layers of different thicknesses, and finally diffused together. The process conditions, and the $R_s$-values obtained are given in Table IV.

Table IV

| Phosphorus Deposition | | Covering Oxide | Diffusion | | |
|---|---|---|---|---|---|
| t(sec) | T(°C.) | Thickness A | t(min) | T(°C.) | $R_s(\Omega/\Box)$ |
| 20 | 200 | 500 | 15 | 1100 | 1620 |
| 20 | 200 | 1500 | 15 | 1100 | 1590 |
| 20 | 200 | 3200 | 15 | 1100 | 1650 |

The $R_s$-values show that thicknesses of the covering layer as far as they are $\geq 500$ Å, are uncritical because, as pointed out above, it may be assumed that covering layers with thicknesses of $<3200$ Å will not influence the diffusion result.

EXAMPLE 5

In Example 5, 12 silicon wafers were processed in the same manner including the application of the covering layer, and subsequently in charges to three wafers heated in the diffusion furnace at 1100° C., each between 30 and 120 minutes for varying periods. The process conditions and the diffusion results are given in Table V.

Table V

| Phosphorus Deposition | | Covering Oxide | Diffusion | | Results | | |
|---|---|---|---|---|---|---|---|
| t(sec) | T(°C.) | Thickness (A) | t(min) | T(°C.) | $R_s(\Omega/)$ | $X_j(\mu m)$ | $C_0$(At/cm$^3$) |
| 30 | 200 | 1000 | 30 | 1100 | 1410 | 0.67 | $4$–$5 \cdot 10^{18}$ |
| 30 | 200 | 1000 | 30 | 1100 | 1450 | 0.67 | $4$–$5 \cdot 10^{18}$ |
| 30 | 200 | 1000 | 30 | 1100 | 1520 | 0.48 | $4$–$5 \cdot 10^{18}$ |
| 30 | 200 | 1000 | 60 | 1100 | 890 | 1.07 | $4 \cdot 10^{18}$ |
| 30 | 200 | 1000 | 60 | 1100 | 820 | 1.06 | $4 \cdot 10^{18}$ |
| 30 | 200 | 1000 | 60 | 1100 | 900 | 1.05 | $4 \cdot 10^{18}$ |
| 30 | 200 | 1000 | 90 | 1100 | 850 | 1.10 | $3 \cdot 10^{18}$ |
| 30 | 200 | 1000 | 90 | 1100 | 800 | 1.20 | $3 \cdot 10^{18}$ |
| 30 | 200 | 1000 | 90 | 1100 | 1060 | 1.23 | $3 \cdot 10^{18}$ |
| 30 | 200 | 1000 | 120 | 1100 | 790 | 1.48 | $2 \cdot 10^{18}$ |
| 30 | 200 | 1000 | 120 | 1100 | 770 | 1.44 | $2 \cdot 10^{18}$ |
| 30 | 200 | 1000 | 120 | 1100 | 760 | 1.25 | $2 \cdot 10^{18}$ |

The results show that with otherwise equal conditions the variation of diffusion time can influence the penetration depth and the surface resistance. With the deposition remaining unchanged and with rising diffusion time, the $R_s$-values decrease, and the $x_j$-values increase. The results of Example 5, as well as of Examples 1, 2 and 4 also indicate that with our process a very homogeneous, predetermined phosphorus deposition can easily be obtained; i.e., our process presents to the semiconductor expert a very well defined phosphorus source, and that it is therefore possible to carry out a very precisely controllable diffusion for reaching high-resistivity dopings.

While our invention has been described with respect to specific embodiments, it will be understood that various changes may be made with the spirit and scope of our invention.

We claim:

1. A process for the surface doping of a semiconductor substrate with phosphorus by diffusion of said phosphorus into said substrate comprising the steps of:

wetting said substrate with a hot phosphorus source consisting essentially of phosphoric acid at a temperature of between 80° and 300° C. for at least about 12 seconds; and prior to the diffusion of said phosphorus into said substrate, coating said substrate with a at least a 500 Å thick covering layer of material which is stable at the diffusion temperature so that the phosphorus will not volatilize during diffusion.

2. A process as in claim 1 wherein the phosphorus source is heated to a temperature between 150° and 230° C.

3. A process as in claims 1 or 2 wherein said phosphorus source comprises orthophosphoric acid.

4. A process as in claims 1 or 2 wherein said phosphorus source comprises pyrophosphoric acid.

5. A process as in claims 1 or 2 wherein said phosphorus source comprises metaphosphoric acid.

6. A process as in claims 1 or 2 wherein said phosphorus source comprises 85 percent orthophosphoric acid heated to the deposition temperature.

7. A process as in claim 3 wherein:
the semiconductor substrate is dipped for 12 or more seconds into the hot phosphorus source;
rinsed with deionized water and, after being coated with the covering layer
maintained for a predetermined period at a predetermined temperature in a diffusion furnace.

8. A process as in claim 7 wherein the semiconductor substrate is dipped between approximately 12 and approximately 30 seconds into the phosphorus source.

9. A process as in claim 7 wherein the rinsing is continued until the resistivity of the flowing-off deionized water has increased to 10 MΩ·cm.

10. A process as in claims 1 or 2 wherein said covering layer comprises a $SiO_2$ layer which is applied by means of cathode sputtering.

11. A process as in claim 10 wherein said cathode sputtering takes place at a substrate temperature ≦270° C.

12. A process as in claim 10 wherein the semiconductor substrate is maintained during said cathode sputtering at a predetermined temperature above 270° C.

13. A process as in claims 1 or 2 wherein said diffusion takes place at a temperature between approximately 900° and approximately 1100° C., for a duration of between approximately 5 minutes and approximately 120 minutes.

14. A process as in claim 13 wherein said diffusion takes place in a nitrogen or argon atmosphere in an open tube.

15. A process as in claims 1 or 2 wherein, for the selective phosphorus doping of the surface of the semiconductor substrate, said surface is partially covered with a masking layer stable at the temperatures involved, which masking layer does not show any pores going from the layer surface down to the semiconductor material.

16. A process as in claim 15 wherein:
silicon is used as the semiconductor material; and
said masking layer is $SiO_2$ which is at least 500 Å thick and which is grown in dry oxygen.

17. A process as in claim 16 wherein:
silicon is used as semiconductor material; and
said masking layer is $SiO_2$ which is produced by means of anodic oxidation.

18. A process as in claims 1 or 2 wherein, prior to said wetting, the semiconductor substrate is dipped for approximately 30 seconds into a 1:10 $HF/H_2O$ mixture.

19. A process as in claims 1 or 2 wherein the semiconductor substrate is first dipped into an acidic medium after wetting and then rinsed with deionized water.

* * * * *